(12) United States Patent
Xiao et al.

(10) Patent No.: US 12,501,779 B2
(45) Date of Patent: Dec. 16, 2025

(54) DISPLAY PANEL, DISPLAY DEVICE AND MANUFACTURING METHOD OF DISPLAY PANEL

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yunsheng Xiao, Beijing (CN); Xiangdan Dong, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 1197 days.

(21) Appl. No.: 17/421,227

(22) PCT Filed: Feb. 12, 2020

(86) PCT No.: PCT/CN2020/074815
§ 371 (c)(1),
(2) Date: Jul. 7, 2021

(87) PCT Pub. No.: WO2021/159293
PCT Pub. Date: Aug. 19, 2021

(65) Prior Publication Data
US 2022/0344418 A1 Oct. 27, 2022

(51) Int. Cl.
*H01L 27/32* (2006.01)
*H10K 59/122* (2023.01)
(Continued)

(52) U.S. Cl.
CPC ......... *H10K 59/122* (2023.02); *H10K 59/131* (2023.02); *H10K 71/00* (2023.02); *H10K 59/1201* (2023.02)

(58) Field of Classification Search
CPC ...... H10K 59/122; H10K 50/84; H10K 71/00; H10K 59/1201; H10K 71/851; H10K 59/124; H10K 59/131; H10K 59/40
See application file for complete search history.

(56) References Cited

U.S. PATENT DOCUMENTS 9,638,949 B1 * 5/2017 Kim ..................... G06F 3/04164
10,135,020 B1 * 11/2018 Zhang .................. H01L 27/0248
(Continued)

FOREIGN PATENT DOCUMENTS

CN  104900675 A  9/2015
CN  107799538 A  3/2018
(Continued)

*Primary Examiner* — Ermias T Woldegeorgis
(74) *Attorney, Agent, or Firm* — The Webb Law Firm (57) ABSTRACT

The present disclosure provides a display panel and a manufacturing method thereof, and a display device. The display panel includes a display area and a non-display area surrounding the display area; the display panel structurally includes a substrate, and a buffer layer, a semiconductor layer, a first inorganic insulating layer, a first metal layer, a second inorganic insulating layer, a second metal layer, a third inorganic insulating layer, a third metal layer, a first organic layer, an anode layer, a pixel defining layer, an organic functional layer and a cathode layer which are located on one side of the substrate and arranged in sequence in a direction away from the substrate; wherein: the non-display area includes a circuit-board bonding area, in which there is a gap between both a boundary of the first organic layer and a boundary of the pixel defining layer and the boundary of the substrate.

19 Claims, 9 Drawing Sheets

(51) Int. Cl.
    *H10K 59/131*     (2023.01)
    *H10K 71/00*     (2023.01)
    *H10K 59/12*     (2023.01)

(56) References Cited

U.S. PATENT DOCUMENTS

| | | | |
|---|---|---|---|
| 10,516,135 B1* | 12/2019 | Shim | G09G 3/3258 |
| 2007/0035239 A1 | 2/2007 | Kang et al. | |
| 2011/0198572 A1 | 8/2011 | Park et al. | |
| 2015/0255739 A1* | 9/2015 | Kim | H10K 59/131 |
| | | | 428/192 |
| 2019/0140216 A1 | 5/2019 | Shin et al. | |
| 2020/0005703 A1 | 1/2020 | Kim et al. | |
| 2020/0279903 A1* | 9/2020 | Zhang | H10K 77/111 |

FOREIGN PATENT DOCUMENTS

| | | |
|---|---|---|
| CN | 108389868 A | 8/2018 |
| CN | 108807227 A | 11/2018 |
| CN | 109659324 A | 4/2019 |
| CN | 109659444 A | 4/2019 |
| CN | 109713019 A | 5/2019 |
| CN | 109768067 A | 5/2019 |
| CN | 110196656 A | 9/2019 |
| CN | 110649135 A | 1/2020 |

* cited by examiner

DISPLAY PANEL, DISPLAY DEVICE AND MANUFACTURING METHOD OF DISPLAY PANEL

CROSS-REFERENCE TO RELATED APPLICATION

This application is the United States national phase of International Application No. PCT/CN2020/074815 filed Feb. 12, 2020, the disclosure of which is hereby incorporated by reference in its entirety.

TECHNICAL FIELD

The present disclosure relates to the field of display technologies, and in particular, to a display panel, a display device, and a manufacturing method of the display panel.

BACKGROUND

Organic light-emitting display devices are marked as the next generation display technology with great development prospects due to their advantages of lightness, thinness, bendability, low power consumption, wide color gamut, high contrast, etc. How to reduce poor short-circuits of display panels of the organic light-emitting display devices and improve production yield thereof has always been a research focus of those skilled in the art.

SUMMARY

According to an aspect of the embodiments of the present disclosure, there is provided a display panel comprising a display area and a non-display area surrounding the display area, the display panel structurally comprising a substrate, and a buffer layer, a semiconductor layer, a first inorganic insulating layer, a first metal layer, a second inorganic insulating layer, a second metal layer, a third inorganic insulating layer, a third metal layer, a first organic layer, an anode layer, a pixel defining layer, an organic functional layer and a cathode layer which are located on one side of the substrate and arranged in sequence in a direction away from the substrate, wherein:
  the first metal layer comprises a gate and a first plate, the second metal layer comprises a second plate, and the third metal layer comprises a source and a drain which are connected with the semiconductor layer through via, wherein the semiconductor layer, the gate, the source and the drain constitute a thin film transistor device located in the display area, the first plate and the second plate constitute a capacitor device located in the display area, and the anode layer is connected with the drain through via, and the anode layer, the organic functional layer and the cathode layer constitute an organic light-emitting device located in the display area; and
  the non-display area comprises a circuit-board bonding area having a bonding section exposed to a surface of the display panel, in which a boundary of at least one of the first inorganic insulating layer, the second inorganic insulating layer, or the third inorganic insulating layer coincides with a boundary of the substrate, and there is a gap between a boundary of the first organic layer and the boundary of the substrate, and there is a gap between a boundary of the pixel defining layer and the boundary of the substrate.

In some embodiments, the bonding section comprises a third contact pad located in the third metal layer.

In some embodiments, the bonding section further comprises a first contact pad located in the first metal layer and/or a second contact pad located in the second metal layer.

In some embodiments, the display panel further comprises: a fourth inorganic insulating layer, a fourth metal layer and a second organic layer which are located between the first organic layer and the anode layer and are arranged in sequence in the direction away from the substrate; a boundary of the fourth inorganic insulating layer coincides with the boundary of the substrate; and there is a gap between a boundary of the second organic layer and the boundary of the substrate.

In some embodiments, the bonding section comprises a fourth contact pad located in the fourth metal layer.

In some embodiments, the bonding section further comprises at least one of a first contact pad located in the first metal layer, a second contact pad located in the second metal layer, and a third contact pad located in the third metal layer.

In some embodiments, the display panel further comprises: a packaging structure layer, a fifth metal layer, a fifth inorganic insulating layer and a touch electrode layer which are located on one side of the cathode layer away from the substrate and are arranged in sequence in the direction away from the substrate, wherein:
  the touch electrode layer comprises a plurality of touch electrode units arranged in an array and a first connection line for connecting adjacent touch electrode units in a first direction, and the fifth metal layer comprises a second connection line for connecting the adjacent touch electrode units through a via in a second direction;
  the bonding section comprises a fifth contact pad, and the fifth contact pad is located in the fifth metal layer or the touch electrode layer; and
  a boundary of the fifth inorganic insulating layer coincides with the boundary of the substrate.

In some embodiments, materials of the first metal layer and the second metal layer are the same.

In some embodiments, materials of the third metal layer and the fourth metal layer are the same.

According to another aspect of the embodiments of the present disclosure, there is provided a display panel comprising a display area and a non-display area surrounding the display area; the display panel structurally comprising a substrate, and a buffer layer, a semiconductor layer, a first inorganic insulating layer, a first metal layer, a second inorganic insulating layer, a second metal layer, a third inorganic insulating layer, a third metal layer, a first organic layer, an anode layer, a pixel defining layer, an organic functional layer and a cathode layer which are located on one side of the substrate and arranged in sequence in a direction away from the substrate; wherein:
  the first metal layer comprises agate and a first plate, the second metal layer comprises a second plate, the third metal layer comprises a source and a drain which are connected with the semiconductor layer through vias, wherein: the semiconductor layer, the gate, the source and the drain constitute a thin film transistor device located in the display area; the first plate and the second plate constitute a capacitor device located in the display area; and the anode layer is connected with the drain through a via, and the anode layer, the organic functional layer and the cathode layer constitute an organic light-emitting device located in the display area; and the non-display area comprises a circuit-board bonding area having a bonding section exposed to a surface of the display panel, in which there is a gap between both a boundary of the first organic layer and a boundary of the pixel defining layer and a boundary of the substrate, and at least one of the first organic layer and the pixel defining layer covers boundaries of the first inorganic insulating layer, the second inorganic insulating layer, and the third inorganic insulating layer.

In some embodiments, the bonding section comprises a third contact pad located in the third metal layer.

In some embodiments, the bonding section further comprises a first contact pad located in the first metal layer and/or a second contact pad located in the second metal layer.

In some embodiments, the display panel further comprises: a fourth inorganic insulating layer, a fourth metal layer and a second organic layer which are located between the first organic layer and the anode layer and are arranged in sequence in the direction away from the substrate; wherein: in the circuit-board bonding area, there is a gap between a boundary of the second organic layer and the boundary of the substrate, and at least one of the second organic layer and the pixel defining layer covers a boundary of the fourth inorganic insulating layer.

In some embodiments, the bonding section comprises a fourth contact pad located in the fourth metal layer.

In some embodiments, the bonding section further comprises at least one of a first contact pad located in the first metal layer, a second contact pad located in the second metal layer, and a third contact pad located in the third metal layer.

In some embodiments, the display panel further comprises: a packaging structure layer, a fifth metal layer, a fifth inorganic insulating layer and a touch electrode layer which are located on one side of the cathode layer away from the substrate and are arranged in sequence in the direction away from the substrate, wherein:

the touch electrode layer comprises a plurality of touch electrode units arranged in an array and a first connection line for connecting adjacent touch electrode units in a first direction, and the fifth metal layer comprises a second connection line for connecting the adjacent touch electrode units through a via in a second direction;

the bonding section comprises a fifth contact pad, and the fifth contact pad is located in the fifth metal layer or the touch electrode layer; and a boundary of the fifth inorganic insulating layer coincides with the boundary of the substrate.

In some embodiments, there is a metal structure at a boundary of at least one of the first inorganic insulating layer, the second inorganic insulating layer, and the third inorganic insulating layer; and at least one of the first organic layer and the pixel defining layer covers the metal structure.

In some embodiments, there is a metal structure at the boundary of the fourth inorganic insulating layer; and at least one of the second organic layer and the pixel defining layer covers the metal structure.

In some embodiments, a gap between the metal structure and the boundary of the substrate is 100-150 microns; and a gap between a boundary of an organic layer covering the metal structure and the boundary of the substrate is 80-95 microns.

In some embodiments, the metal structure employs a same material as a metal layer farthest from the substrate in the bonding section; or, the material of the metal structure comprises at least one of materials employed by the metal layer farthest from the substrate in the bonding section.

In some embodiments, there is a gap between the metal structure and a boundary of an inorganic insulating layer; and the inorganic insulating layer is at least one of the first inorganic insulating layer, the second inorganic insulating layer, the third inorganic insulating layer, and the fourth inorganic insulating layer.

According to still another aspect of the embodiments of the present disclosure, there is provided a display device comprising: the display panel according to any of the foregoing technical solutions, and a circuit board bound to the circuit-board bonding area of the display panel.

According to a further aspect of the embodiments of the present disclosure, there is provided a manufacturing method of a display panel, comprising:
    manufacturing a whole panel comprising a plurality of display panel units, wherein each display panel unit comprises a display area and a non-display area surrounding the display area, the non-display area comprises a circuit-board bonding area, and a cutting area is arranged between adjacent display panel units;
    cutting the whole panel along the cutting area to separate out each display panel unit, wherein each independent display panel unit is one display panel;
    wherein manufacturing the whole panel comprises:
    forming a buffer layer, a semiconductor layer, a first inorganic insulating layer, a first metal layer, a second inorganic insulating layer, a second metal layer, a third inorganic insulating layer, a third metal layer, a first organic layer, an anode layer, a pixel defining layer, an organic functional layer and a cathode layer in sequence on one side of the substrate in a direction away from the substrate, wherein:
    a boundary of at least one of the first inorganic insulating layer, the second inorganic insulating layer, and the third inorganic insulating layer coincides with a boundary of the substrate, and there is a gap between both a boundary of the first organic layer and a boundary of the pixel defining layer and the boundary of the substrate.

According to a further aspect of the embodiments of the present disclosure, there is provided a manufacturing method of a display panel, comprising:
    manufacturing a whole panel comprising a plurality of display panel units, wherein each display panel unit comprises a display area and a non-display area surrounding the display area, the non-display area comprises a circuit-board bonding area, and a cutting area is arranged between adjacent display panel units;
    cutting the whole panel along the cutting area to separate out each display panel unit, wherein each independent display panel unit is one display panel;
    wherein manufacturing the whole panel comprises:
    forming a buffer layer, a semiconductor layer, a first inorganic insulating layer, a first metal layer, a second inorganic insulating layer, a second metal layer, a third inorganic insulating layer, a third metal layer, a first organic layer, an anode layer, a pixel defining layer, an organic functional layer and a cathode layer in sequence on one side of the substrate in a direction away from the substrate, wherein:
    there is a gap between both a boundary of the first organic layer and a boundary of the pixel defining layer and a boundary of the substrate, and at least one of the first organic layer and the pixel defining layer covers boundaries of the first inorganic insulating layer, the second inorganic insulating layer, and the third inorganic insulating layer.

BRIEF DESCRIPTION OF THE DRAWINGS

The accompanying drawings, which constitute a part of this specification, illustrate embodiments of the present disclosure and, together with the specification, serve to explain the principles of the present disclosure.

The present disclosure may be more clearly understood from the following detailed description made in conjunction with the accompanying drawings, in which:

FIG. 6b is a top view of a touch structure of the embodiment shown in FIG. 6a;

It should be understood that sizes of various parts shown in the accompanying drawings are not necessarily drawn to actual scales. Furthermore, identical or similar reference numerals denote identical or similar components.

DETAILED DESCRIPTION

Exemplary embodiments of the present disclosure will now be described in detail with reference to the accompanying drawings. The description of the exemplary embodiments is merely illustrative and is in no way intended to limit this disclosure, its application, or uses. The present disclosure may be implemented in many different forms and is not limited to the embodiments described herein. These embodiments are provided to make this disclosure thorough and complete, and fully convey the scope of this disclosure to those skilled in the art. It should be noted that: the relative arrangement of components and steps, composition of materials, numerical expressions and numerical values set forth in these embodiments are to be construed to be merely illustrative, instead of restrictive, unless specifically stated otherwise.

The words "first," "second," and the like used in this disclosure is not intended to indicate any sequence, number, or importance, but rather is used to distinguish different parts. The word "comprising" or "including", or the like, means that an element preceding the word covers a listed element following the word, and does not preclude the possibility that another element may also be covered. The words "up", "down", and so on, are used only to indicate relative position relations, and when an absolute position of a described object changes, the relative position relations may also change correspondingly.

In the present disclosure, when a specific device is described as being located between a first device and a second device, there may or may not be an intervening device between the specific device and the first device or the second device. When it is described that a specific device is connected to another device, the specific device may be directly connected to the other device without an intervening device, or may be indirectly connected to the other device with an intervening device.

All terms (including technical or scientific terms) used herein have the same meanings as those commonly understood by one of ordinary skill in the art to which this disclosure belongs unless specifically defined otherwise. It will be further understood that terms, defined in, e.g., common dictionaries, should be interpreted as having meanings consistent with their meanings in the context of the related art and will not be interpreted in an idealized or extremely formalized sense unless expressly defined herein.

Techniques, methods, and apparatus known to one of ordinary skill in the related art may not be discussed in detail but are intended to be regarded as a part of the specification where appropriate.

Figure 1:
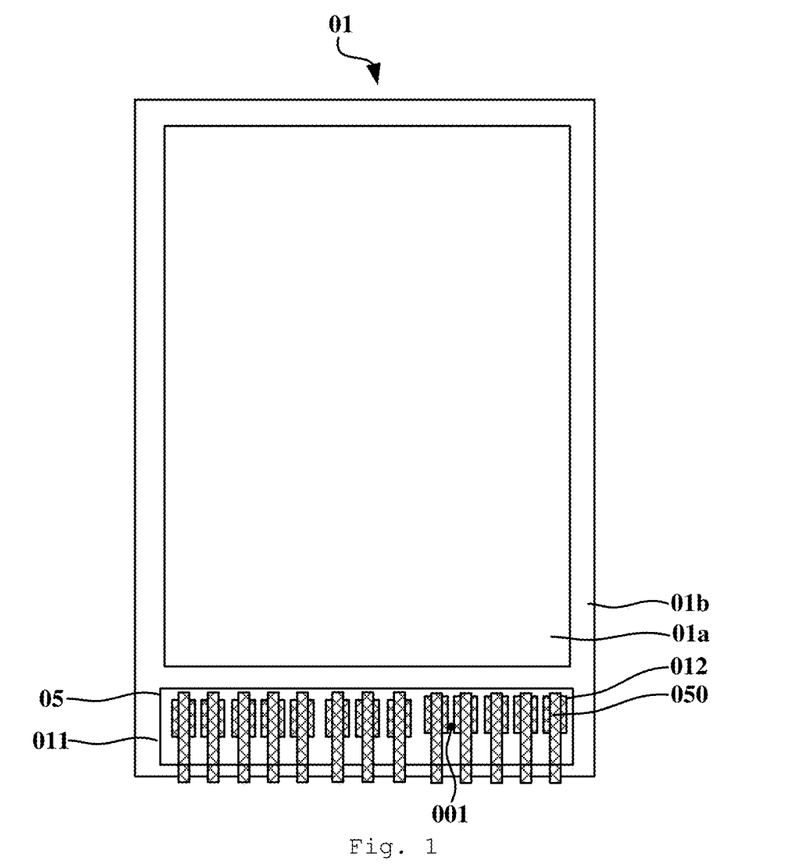
FIG. 1 is a front view of a related-art display panel after being bound with a circuit board.

FIG. 1 is a front view of a related-art display panel after being bound with a circuit board. The display panel 01 comprises a display area 01a and a non-display area 01b surrounding the display area 01a. The non-display area 01b comprises a circuit-board bonding area 011, and the circuit-board bonding area 011 is provided with a plurality of first bonding sections 012. The plurality of first bonding sections 012 herein are used for bonding in one-to-one correspondence with a plurality of second bonding sections 050 provided on a circuit board 05.

A manufacturing process of the above display panel 01 comprises: first, manufacturing a whole panel comprising a plurality of display panel units; and then, carrying out laser cutting on the whole panel to separate out each display panel unit, wherein each independent display panel unit is one display panel. After the display panel is manufactured, it is also needed to bond a circuit board to the circuit-board bonding area.

In the process of implementing the embodiments of the present application, inventors of the present application have found that the display panel 01 in the related art, after being bound with the circuit board 05, often has poor short circuits, thereby causing a depression in product yield.

To solve the above technical problem, the embodiments of the present disclosure provide a display panel, a display device and a manufacturing method of the display panel.

Figure 2:
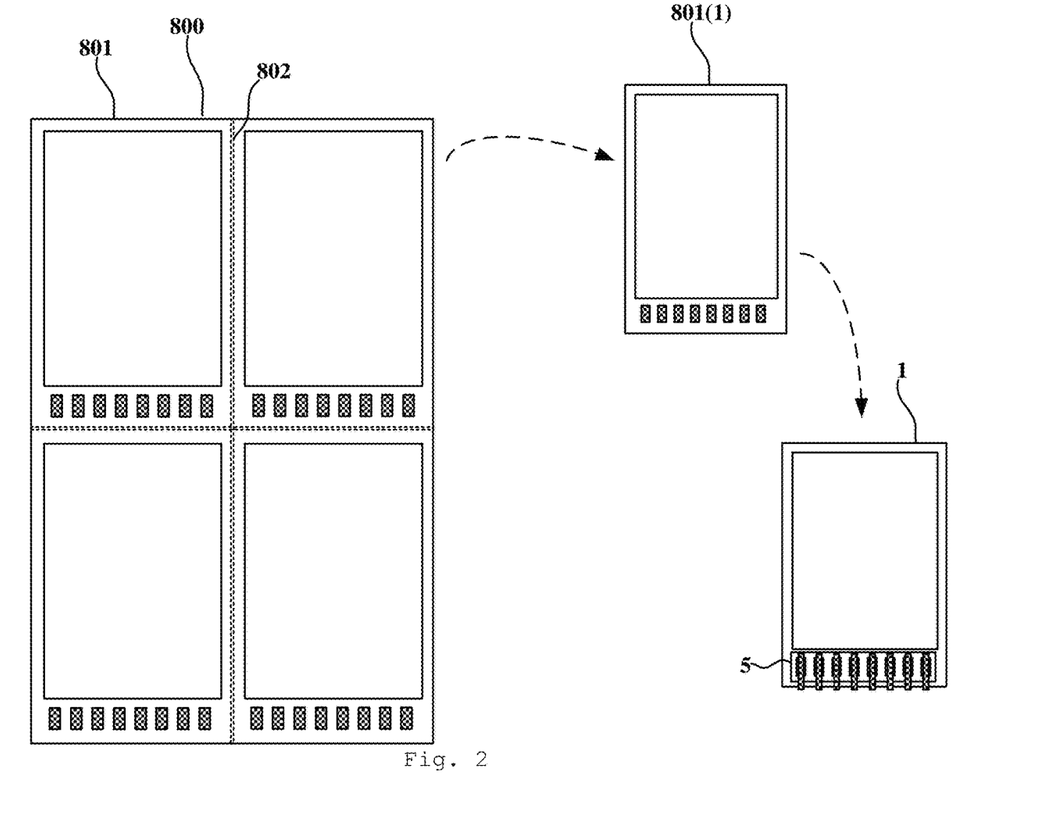
FIG. 2 is a schematic diagram of cutting a whole panel and bonding a display panel with a circuit board according to an embodiment of the present disclosure.
Figure 3:
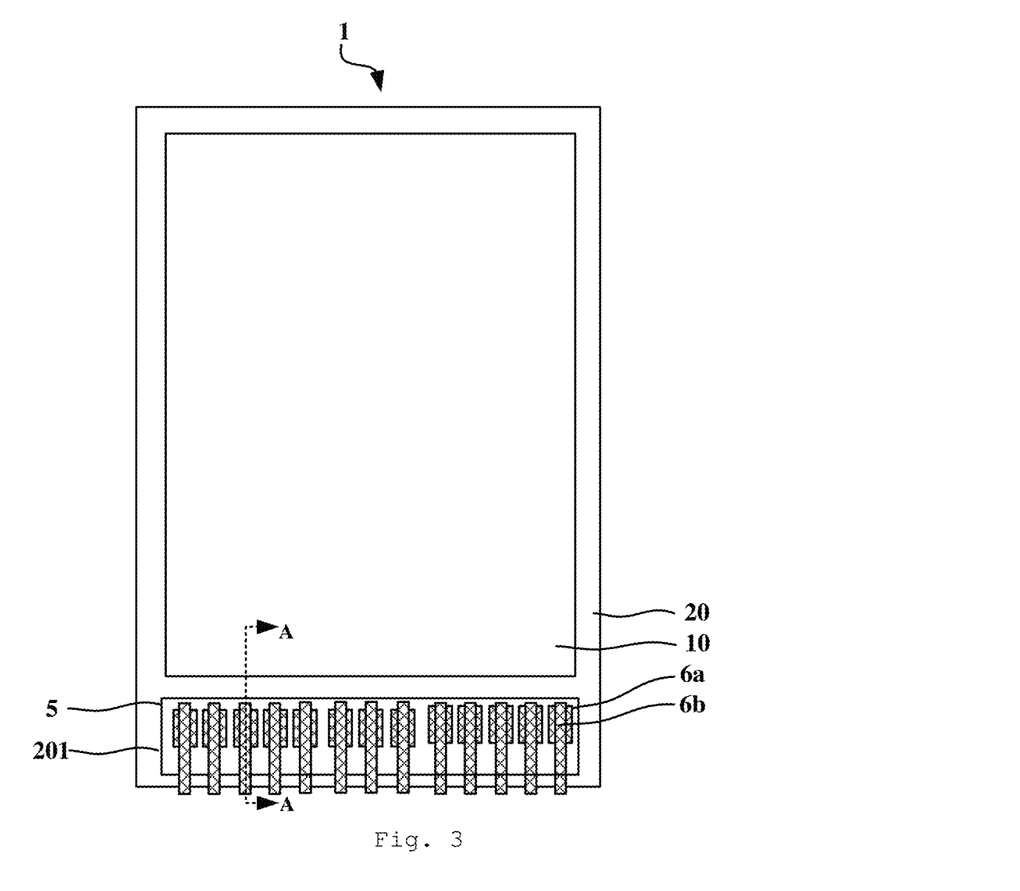
FIG. 3 is a front view of a display panel after being bound with a circuit board according to an embodiment of the present disclosure.
Figure 4A:
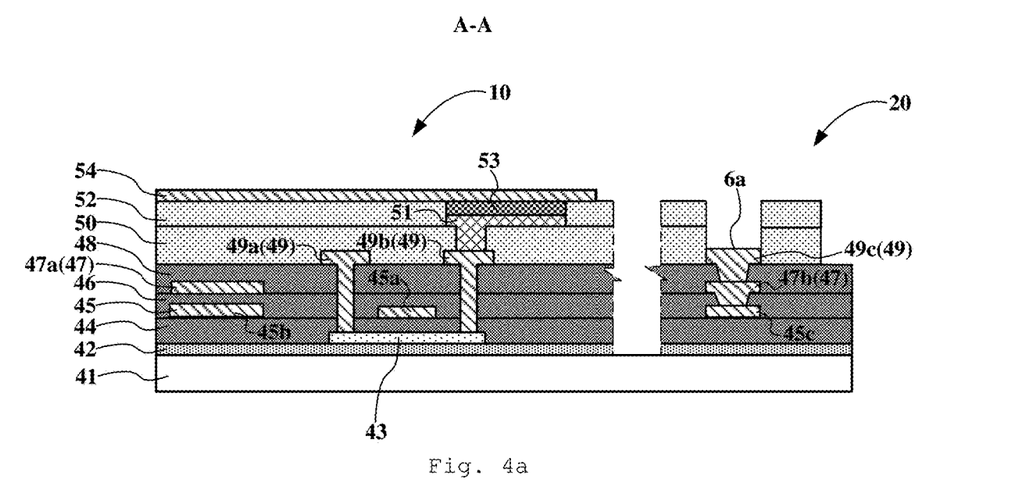
FIG. 4a is a cross-sectional view at A-A of FIG. 3 according to an embodiment of the present disclosure.

The display panel of the embodiments of the present disclosure is obtained by cutting a whole panel. As shown in FIGS. 2, 3 and 4a, FIG. 2 is a schematic diagram of cutting a whole panel and bonding a display panel with a circuit board according to an embodiment of the present disclosure, FIG. 3 is a front view of a display panel after being bound with a circuit board according to an embodiment of the present disclosure, and FIG. 4a is a cross-sectional view of a display area and a non-display area according to an embodiment of the present disclosure.

As shown in FIGS. 3 and 4a, an embodiment of the present disclosure provides a display panel 1 comprising a display area 10 and a non-display area 20 surrounding the display area 10; the display panel 1 structurally comprises a substrate 41, and a buffer layer 42, a semiconductor layer 43, a first inorganic insulating layer 44, a first metal layer 45, a second inorganic insulating layer 46, a second metal layer 47, a third inorganic insulating layer 48, a third metal layer 49, a first organic layer 50, an anode layer 51, a pixel defining layer 52, an organic functional layer 53, and a cathode layer 54, which are located on one side of the substrate 41 and arranged in sequence in a direction away from the substrate 41; wherein:

the first metal layer 45 comprises a gate 45a and a first plate 45b, the second metal layer 47 comprises a second plate 47a, and the third metal layer 49 comprises a source 49a and a drain 49b connected with the semiconductor layer 43 through vias, wherein: the semiconductor layer 43, the gate 45a, the source 49a, and the drain 49b constitute a thin film transistor device located in the display area 10; the first plate 45b and the second plate 47a constitute a capacitor device located in the display area 10; the anode layer 51 is connected with the drain 49b through a via, and the anode layer 51, the organic functional layer 53 and the cathode layer 54 constitute an organic light-emitting device located in the display area 10;
and
the non-display area 20 comprises a circuit-board bonding area 201 having a bonding section 6a exposed to a surface of the display panel 1, in which a boundary of at least one of the first inorganic insulating layer 44, the second inorganic insulating layer 46, or the third inorganic insulating layer 48 coincides with a boundary of the substrate 41, and there is a gap between both a boundary of the first organic layer 50 and the boundary of the substrate 41, and there is a gap between a boundary of the pixel defining layer 52 and the boundary of the substrate 41.

The display area 10 of the display panel 1 is used for displaying an image, and the non-display area 20 is used for arranging related circuits to support the display of the display area 10. The circuit-board bonding area 201 is mainly used for bonding the circuit board 5, and the circuit board 5 is, for example, a flexible printed circuit board.

Figure 4B:
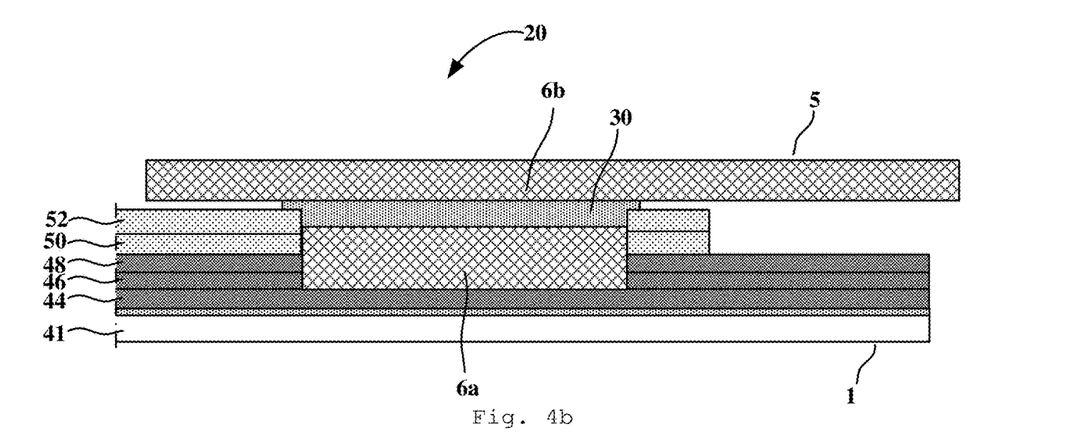
FIG. 4b is a schematic cross-sectional view of a display panel after being bound with a circuit board according to an embodiment of the present disclosure.

In the embodiment shown in FIG. 3 of the present disclosure, the display panel 1 is rectangular as a whole, and the circuit-board bonding area 201 is located at one side of the non-display area 20. The circuit-board bonding area 201 comprises a plurality of bonding sections 6a, which are bound in one-to-one correspondence with a plurality of bonding section 6b provided on the circuit board 5, thereby enabling signal transmission between the circuit board 5 and the display panel 1. As shown in FIG. 4b, it is a schematic cross-sectional view of the display panel 1 employing the above structure after being bound with the circuit board 5, wherein the bonding section 6b of the circuit board 5 and the bonding section 6a of the display panel 1 are bound together by a conductive film 30.

As shown in FIG. 4a, to achieve the bonding with the circuit board, the bonding section 6a is exposed to the surface of the display panel 1. The bonding section 6a can comprise one or more layers of contact pads. When the bonding section 6a comprises more than one layer of contact pads, contact pads of adjacent layers are connected through via. As shown in FIG. 4a, in some embodiments of the present disclosure, the bonding section 6a comprises a first contact pad 45c located in the first metal layer 45, a second contact pad 47b located in the second metal layer 47, and a third contact pad 49c located in the third metal layer 49.

It is to be understood that the shape of the display panel 1 is not limited to rectangular shown in the figure, and can also be, for example, circular, elliptical, regular polygon, or an irregular shape, etc., depending on the product type of the display device. The display panel 1 can be a flat display panel, a curved display panel, or a flexible display pane 1. In an embodiment of the present disclosure, the display panel 1 is a flexible organic light-emitting display panel.

In the embodiment of the present disclosure, a specific material type of the substrate 41 is not limited, and can be, for example, a glass substrate or a resin substrate. The substrate 41 can be a rigid substrate or a flexible substrate. The flexible substrate can employ a Polyimide (PI) material. A specific material of each inorganic insulating layer is not limited, for example, silicon nitride can be employed, and a pattern of the inorganic insulating layer is generally formed by a dry etching process. A specific material of each organic layer is not limited, for example, resin can be employed, and a pattern of the organic layer is generally formed by a wet etching process. The first metal layer 45 and the second metal layer 47 can employ same or different materials.

In the process of implementing the embodiments of the present disclosure, the inventors of the present disclosure have found that there are the following two main reasons why the related-art display panel is prone to poor short circuits after being bound to the circuit board:

first, when the whole panel is subject to laser cutting, chip particles flying out of the organic layer will be carbonized due to laser burning, so that the chip particles have conductivity, and the conductive chip particles fall on the circuit-board bonding area, and thus are prone to cause short circuits of related circuits.

Second, due to anisotropic etching characteristics of dry etching, after the pattern of the inorganic insulating layer is formed by the dry etching process, an angle between a section (etched section) of the inorganic insulating layer and a manufacturing base surface is about 60-70 degrees, and the section is steep relative to the manufacturing base surface. Subsequently, when a pattern of the metal layer is manufactured through a mask process, metal at the angle between the section and the manufacturing base surface is not easy to be removed, and a metal structure remaining there will cause short circuits of related circuits when it is in contact with other conductive structures subsequently manufactured.

The first organic layer 50 comprises a part located in the display area 10 and a part located in the non-display area 20, wherein the part of the first organic layer 50 located in the display area 10 mainly serves as a planarization layer. As shown in FIG. 4a, by using the technical solution of the above embodiment of the present disclosure, there is a gap between both the boundary of the first organic layer 50 and the boundary of the pixel defining layer 52 and the boundary of the substrate 41, that is, the cutting area 802 in FIG. 2 is not covered by the organic layer, so that when the whole panel is subject to laser cutting, the organic layer will not be cut, thereby effectively avoiding short circuits caused by carbonization of the chip particles of the organic layer. The boundary of at least one of the first inorganic insulating layer 44, the second inorganic insulating layer 46 and the third inorganic insulating layer 48 coincides with the boundary of the substrate 41, so that the dry etching of the inorganic insulating layer in the circuit-board bonding area 201 is minimized, thereby improving short circuits caused by the residual metal at the section of the inorganic insulating layer. In some embodiments of the present disclosure, the boundaries of the first inorganic insulating layer 44, the second inorganic insulating layer 46 and the third inorganic insulating layer 48 all coincide with the boundary of the substrate 41, which can more effectively improve short circuits caused by the residual metal.

Figure 5:
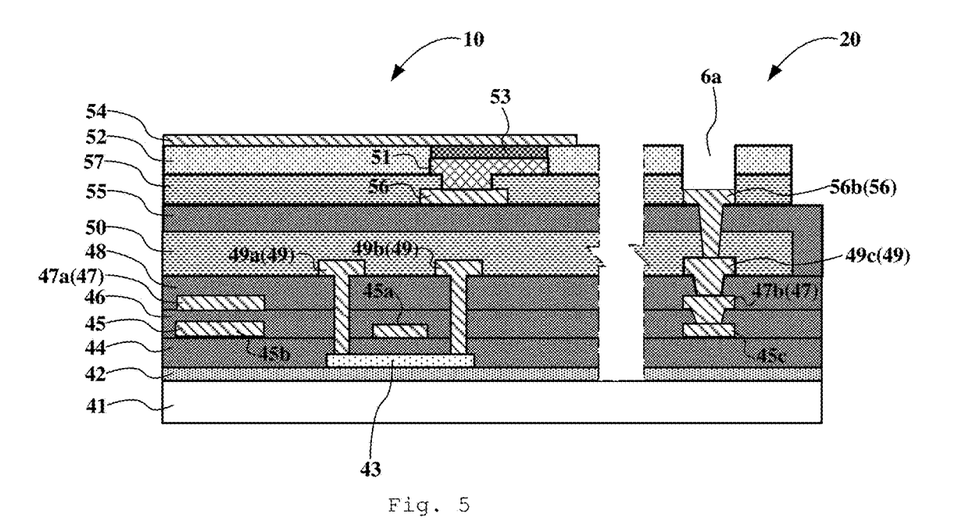
FIG. 5 is a cross-sectional view at A-A of FIG. 3 according to another embodiment of the present disclosure.

Please refer to FIGS. 3 and 5, wherein FIG. 5 is a cross-sectional view of a display area and a non-display area according to another embodiment of the present disclosure. On the basis of the embodiment shown in FIG. 4a, the display panel 1 of this embodiment further comprises: a fourth inorganic insulating layer 55, a fourth metal layer 56, and a second organic layer 57 which are located between the first organic layer 50 and the anode layer 51 and are arranged in sequence in the direction away from the substrate 41; wherein a boundary of the fourth inorganic insulating layer 55 coincides with the boundary of the substrate 41; and there is a gap between a boundary of the second organic layer 57 and the boundary of the substrate 41.

A part of the fourth metal layer 56 in the display area 10 can serve as a data line, and is connected with a part of the third metal layer 49 in the display area 10 through a via (not shown), to enable signal transmission between the fourth metal layer 56 and the third metal layer 49. A same material can be employed for the fourth metal layer 56 and the third metal layer 49.

In this embodiment, the bonding section 6a comprises, in addition to the first contact pad 45c, the second contact pad 47b, and the third contact pad 49c, a fourth contact pad 56b located in the fourth metal layer 56. As described above, the specific structure of the bonding section 6a is not limited to this, and can comprise at least one of the first contact pad 45c, the second contact pad 47b, the third contact pad 49c, and the fourth contact pad 56b. Similar to the first organic layer 50, the second organic layer 57 comprises a part located in the display area 10 and a part located in the non-display area 20, wherein the part of the second organic layer 57 located in the display area 10 mainly serves as a planarization layer. Similar to the beneficial effects of the foregoing embodiments, since there is a gap between the boundary of the second organic layer 57 and the boundary of the substrate 41, short circuits caused by cutting the organic layer can be effectively avoided. Since the boundary of the fourth inorganic insulating layer 55 coincides with the boundary of the substrate 41, short circuits caused by the residual metal at the section of the inorganic insulating layer can be effectively improved.

Figure 6A:
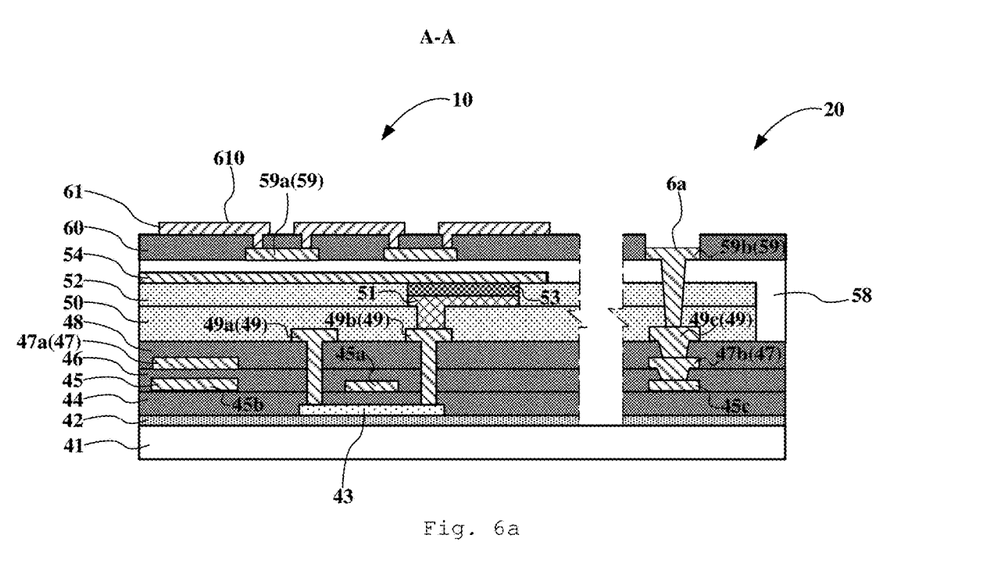
FIG. 6a is a cross-sectional view at A-A of FIG. 3 according to still another embodiment of the present disclosure.
Figure 6B:
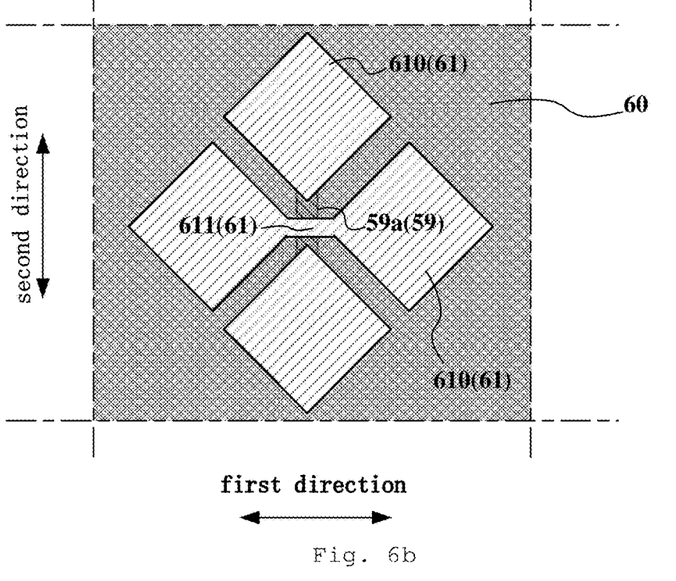

Please refer to FIGS. 3, 6a and 6b, wherein FIG. 6a is a cross-sectional view of a display area and a non-display area according to another embodiment of the present disclosure, and FIG. 6b is a top view of a touch structure located in a display area according to the embodiment. The display panel 1 of the embodiment is a touch display panel. On the basis of the embodiment shown in FIG. 4a (or on the basis of the embodiment shown in FIG. 5), the display panel 1 of this embodiment further comprises: a packaging structure layer 58, a fifth metal layer 59, a fifth inorganic insulating layer 60 and a touch electrode layer 61 which are located on one side of the cathode layer 54 away from the substrate 41 and are arranged in sequence in the direction away from the substrate 41, wherein: the touch electrode layer 61 comprises a plurality of touch electrode units 610 arranged in an array, and a first connection line 611 for connecting adjacent touch electrode units 610 in a first direction, and the fifth metal layer 59 comprises a second connection line 59a for connecting the adjacent touch electrode units 610 in a second direction (for example, two adjacent touch electrode units 610 adjacent in the second direction are separately connected with the same second connection line 59a through vias); the bonding section 6a further comprises a fifth contact pad 59b, and the fifth contact pad 59b is located in the fifth metal layer 59 or the touch electrode layer 61; and a boundary of the fifth inorganic insulating layer 60 coincides with the boundary of the substrate 41.

Similar to the beneficial effects of the foregoing embodiments, the structure design of the display panel with a touch function can also improve poor short circuits in the circuit-board bonding area.

Figure 7A:
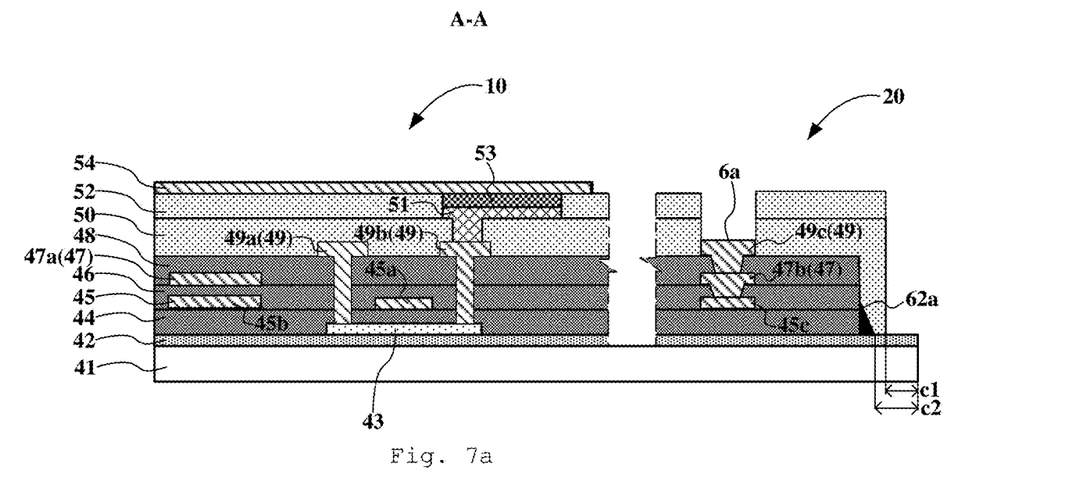
FIG. 7a is a cross-sectional view at A-A of FIG. 3 according to a further embodiment of the present disclosure.

Please refer to FIGS. 3 and 7a, wherein FIG. 7a is a cross-sectional view of a display area and a non-display area according to another embodiment of the present disclosure. A display panel 1 of this embodiment comprises a display area 10 and a non-display area 20 surrounding the display area 10; the display panel 1 structurally comprises a substrate 41, and a buffer layer 42, a semiconductor layer 43, a first inorganic insulating layer 44, a first metal layer 45, a second inorganic insulating layer 46, a second metal layer 47, a third inorganic insulating layer 48, a third metal layer 49, a first organic layer 50, a anode layer 51, a pixel defining layer 52, an organic functional layer 53, and a cathode layer 54 which are located on one side of the substrate 41 and arranged in sequence in a direction away from the substrate 41; wherein:

the first metal layer 45 comprises a gate 45a and a first plate 45b, the second metal layer 47 comprises a second plate 47a, and the third metal layer 49 comprises a source 49a and a drain 49b which are connected to the semiconductor layer 43 through vias, wherein: the semiconductor layer 43, the gate 45a, the source 49a, and the drain 49b constitute a thin film transistor device located in the display area 10; the first plate 45b and the second plate 47a constitute a capacitor device located in the display area 10; the anode layer 51 is connected with the drain 49b through a via, and the anode layer 51, the organic functional layer 53 and the cathode layer 54 constitute an organic light-emitting device located in the display area 10; and the non-display area 20 comprises a circuit-board bonding area 201 having a bonding section 6a exposed to a surface of the display panel 1, in which there is a gap between both a boundary of the first organic layer 50 and a boundary of the pixel defining layer 52 and a boundary of the substrate 41, and at least one of the first organic layer 50 and the pixel defining layer 52 covers boundaries of the first inorganic insulating layer 44, the second inorganic insulating layer 46, and the third inorganic insulating layer 48.

Figure 7B:
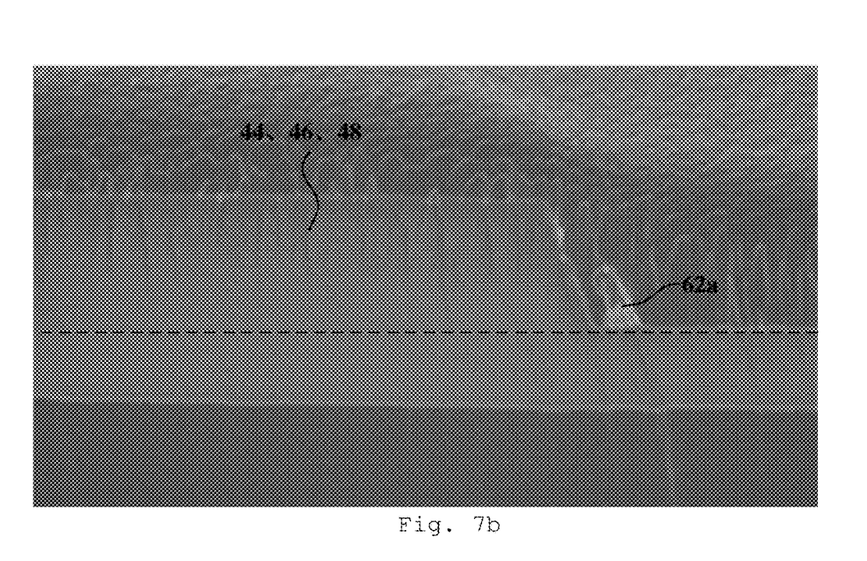
FIG. 7b is an electron micrograph of residual metal at a cross section of an inorganic insulating layer.

In some embodiments, as shown in FIG. 7a, there is also a metal structure 62a at a boundary of at least one of the first inorganic insulating layer 44, the second inorganic insulating layer 46, and the third inorganic insulating layer 48; and at least one of the first organic layer 50 and the pixel defining layer 52 covers the metal structure 62a. In some embodiments, as shown in FIG. 7b, there is usually a gap between the metal structure 62a and a section of an inorganic insulating layer; and after the first organic layer 50 and the pixel defining layer 52 are formed, at least one of them covers the metal structure 62a while the gap between the metal structure 62a and the section of the inorganic insulating layer is filled; wherein the above inorganic insulating layer can be at least one of the first inorganic insulating layer, the second inorganic insulating layer, and the third inorganic insulating layer.

Figure 7C:
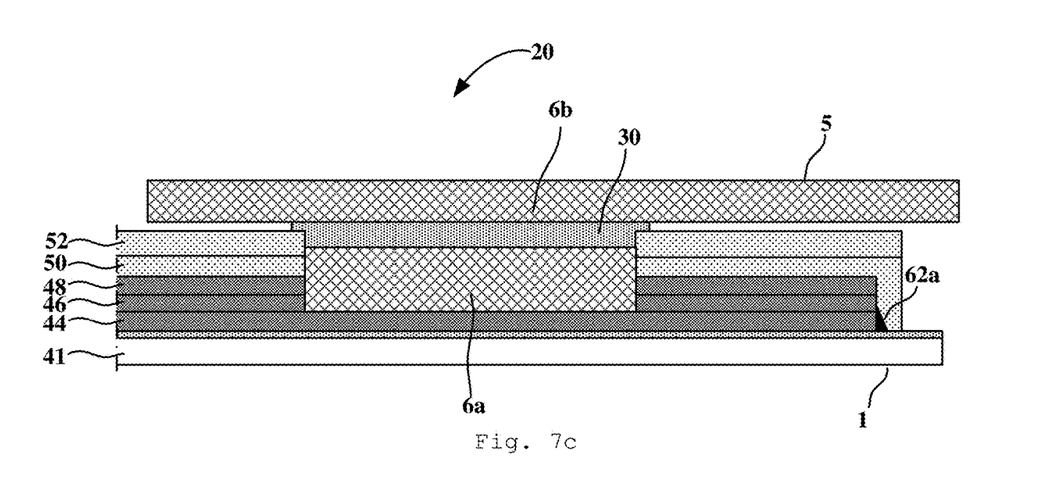
FIG. 7c is a schematic cross-sectional view of a display panel after being bound with a circuit board according to a further embodiment of the present disclosure.

As shown in FIG. 7c, it is a schematic cross-sectional view of the display panel 1 employing the above structure after being bound with the circuit board 5, wherein the bonding section 6b of the circuit board 5 and the bonding section 6a of the display panel 1 are bound together through a conductive film 30.

By adopting the technical solution of the embodiment of the present disclosure, there is a gap between both the boundary of the first organic layer 50 and the boundary of the pixel defining layer 52 and the boundary of the substrate 41, that is, the cutting area 802 in FIG. 2 is not covered by the organic layer, so that when the whole panel is subject to laser cutting, the organic layer will not be cut, thereby effectively avoiding short circuits caused by carbonization of the chip particles of the organic layer. Meanwhile, the organic layer is used for covering the boundary of the inorganic insulating layer, so that even if there is residual metal (e.g., the foregoing metal structure 62a) at the section of the inorganic insulating layer when the metal layer is manufactured, the residual metal can be insulated from other conductive structures because it is covered by the organic layer, and thus, the solution can also improve short circuits caused by the residual metal at the section of the inorganic insulating layer.

Other structure designs of the display panel can be similar to the forgoing embodiments, and similarities in design are not repeated herein.

Figure 8:
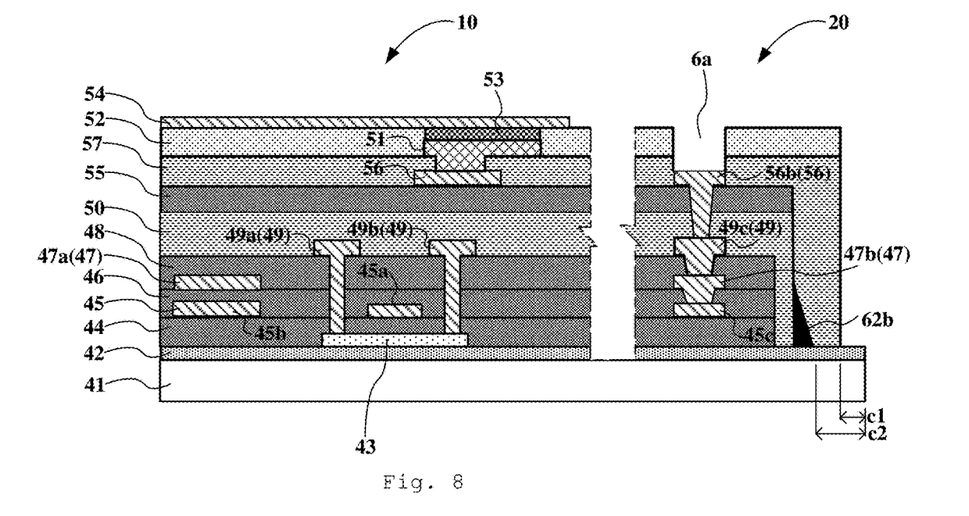
FIG. 8 is a cross-sectional view at A-A of FIG. 3 according to a further embodiment of the present disclosure.

Please refer to FIGS. 3 and 8, wherein FIG. 8 is a cross-sectional view of a display area and a non-display area according to another embodiment of the present disclosure. On the basis of the embodiment shown in FIG. 7a, the display panel 1 of this embodiment further comprises: a fourth inorganic insulating layer 55, a fourth metal layer 56, and a second organic layer 57 which are located between the first organic layer 50 and the anode layer 51 and are arranged in sequence in the direction away from the substrate 41; wherein there is a gap between a boundary of the second organic layer 57 and the boundary of the substrate 41, and at least one of the second organic layer 57 and the pixel defining layer 52 further covers a boundary of the fourth inorganic insulating layer 55.

In some embodiments, as shown in FIG. 8, there is a metal structure 62b at the boundary of the fourth inorganic insulating layer 55; and at least one of the second organic layer 57 and the pixel defining layer 52 covers the metal structure 62b. In an embodiment, there is usually a gap between the metal structure 62b and a section of the fourth inorganic insulating layer; and at least one of the second organic layer 57 and the pixel defining layer 52 covers the metal structure 62b while the gap between the metal structure 62b and the section of the fourth inorganic insulating layer is filled.

Similar to the beneficial effects of the embodiment shown in FIG. 7a, since there is a gap between the boundary of the second organic layer 57 and the boundary of the substrate 41, short circuits caused by cutting the organic layer can be effectively avoided. Since the organic layer covers the boundary of the inorganic insulating layer, even if there is residual metal (e.g., the foregoing metal structure 62b) at the boundary of the fourth inorganic insulating layer 55 when the metal layer is manufactured, the residual metal can be insulated from other conductive structures because it is covered by the second organic layer 57 or the pixel defining layer 52. Therefore, the solution can also improve short circuits caused by the residual metal at the section of the inorganic insulating layer.

In the embodiments shown in FIGS. 7a and 8 of the present disclosure, a gap c2 between the metal structures 62a, 62b and the boundary of the substrate 41 can be 100-150 microns; and a gap c1 between boundaries of organic layers covering the metal structures 62a, 62b and the boundary of the substrate 41 can be designed to be 80-95 microns, to ensure sufficiently covering the metal structures.

Other structure designs of the display panel can be similar to the forgoing embodiments, and similarities in design are not repeated herein.

Figure 9:
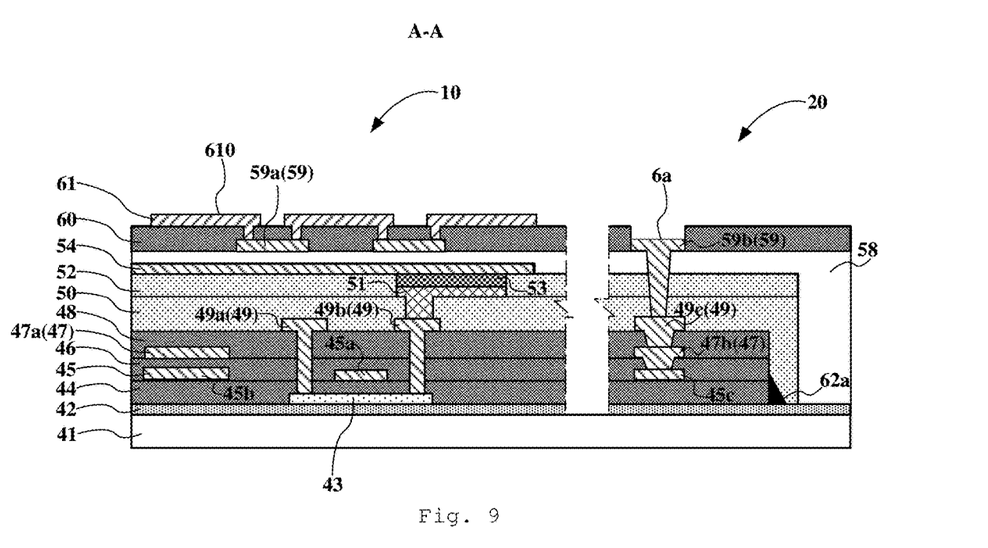
FIG. 9 is a cross-sectional view at A-A of FIG. 3 according to a further embodiment of the present disclosure.

As shown in FIGS. 3, 6b and 9, FIG. 9 is a cross-sectional view of a display area and a non-display area according to another embodiment of the present disclosure. In the embodiment, the touch structure located in the display area can refer to FIG. 6b. The display panel 1 of this embodiment is a touch display panel. On the basis of the embodiment shown in FIG. 7a (or on the basis of the embodiment shown in FIG. 8), the display panel 1 of this embodiment further comprises: a packaging structure layer 58, a fifth metal layer 59, a fifth inorganic insulating layer 60 and a touch electrode layer 61, which are located on one side of the cathode layer 54 away from the substrate 41 and are arranged in sequence in the direction away from the substrate 41, wherein: the touch electrode layer 61 comprises a plurality of touch electrode units 610 arranged in an array, and a first connection line 611 for connecting adjacent touch electrode units 610 in a first direction, and the fifth metal layer 59 comprises a second connection line 59a for connecting the adjacent touch electrode units 610 in a second direction (for example, two touch electrode units 610 adjacent in the second direction are separately connected with the same second connection line 59a through vias); the bonding section 6a further comprises a fifth contact pad 59b, and the fifth contact pad 59b is located in the fifth metal layer 59 or the touch electrode layer 61; and a boundary of the fifth inorganic insulating layer 60 coincides with the boundary of the substrate 41.

Similar to the beneficial effects of the foregoing embodiments, since there is a certain gap between the boundaries of the first organic layer 50 and the pixel defining layer 52 and the boundary of the substrate 41, short circuits caused by carbonization of the chip particles of the organic layer can be effectively avoided. By using at least one of the first organic layer 50 and the pixel defining layer 52 to cover the boundaries of the first inorganic insulating layer 44, the first inorganic insulating layer 46, and the third inorganic insulating layer 48, even if there is residual metal (e.g., the metal structure 62a) at the sections of the first inorganic insulating layer 44, the first inorganic insulating layer 46, and the third inorganic insulating layer 48 when the metal layer is manufactured, the residual metal can be insulated from other conductive structures because it is covered with the organic layer, and thus, short circuits caused by the residual metal at the section of the inorganic insulating layer can be improved. Because the boundary of the fifth inorganic insulating layer 60 coincides with the boundary of the substrate 41, the dry etching of the fifth inorganic insulating layer 60 in the circuit-board bonding area 201 can be minimized, thereby improving short circuits caused by the residual metal at the section of the inorganic insulating layer.

Other structure designs of the display panel can be similar to the foregoing embodiments, and similarities in design are not repeated herein.

Figure 10:
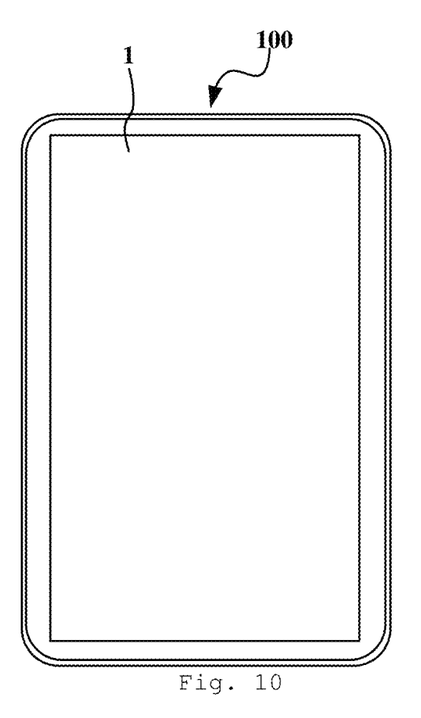
FIG. 10 is a front view of a display device according to an embodiment of the present disclosure.

As shown in FIGS. 10 and 3, an embodiment of the present disclosure further provides a display device 100, which comprises the display panel 1 of any of the foregoing embodiments, and a circuit board 5 bound to the circuit-board bonding area 201 of the display panel 1.

Specifically, the circuit-board bonding area 201 is provided with a plurality of bonding sections 211, the circuit board 5 is provided with a plurality of bonding sections 6*b*, and the bonding sections 6*b* are bound in a one-to-one correspondence with the bonding sections 6*a*, so as to enable signal transmission between the circuit board 5 and the display panel 1.

As shown in FIGS. 4*b* and 7*c*, in some embodiments, the bonding section 6*b* of the circuit board 5 and the bonding section 6*a* of the display panel 1 are bound together through a conductive film 30. The conductive Film 30 is, for example, an Anisotropic Conductive Film (ACF). To ensure the reliability of the bonding connection, the conductive film 30 covers the bonding section 6*a* and exceeds an edge of the bonding section 6*a*, i.e., an orthographic projection of the bonding section 6*a* on the substrate 41 falls within an orthographic projection of the conductive film 30 on the substrate 41.

Through the analysis of the display panel according to the above embodiment of the present disclosure, after the circuit board 5 is bound with the display panel 1, the problem of short circuits in the related art can be significantly reduced or even avoided, and thus, the product yield of the display device is improved, and the production cost is reduced.

In the embodiment of the present disclosure, the display device can be a flat-screen display device, a curved-screen display device, or a flexible-screen display device. The specific product type of the display device is not limited, and can be, for example, a mobile phone, a tablet computer, a display, a television set, a picture screen, an advertisement screen, smart wearing, vehicle navigation, and so on.

Referring to FIGS. 2 and 3, an embodiment of the present disclosure further provides a manufacturing method of a display panel, comprising:

step 1: manufacturing a whole panel comprising a plurality of display panel units, wherein each display panel unit comprises a display area and a non-display area surrounding the display area, the non-display area comprises a circuit-board bonding area, and a cutting area is arranged between adjacent display panel units; and step 2: cutting the whole panel along the cutting area to separate out each display panel unit, wherein each independent display panel unit is one display panel, e.g., the display panel 1 shown in FIG. 3.

In an embodiment, the step 1 comprises:

forming a buffer layer, a semiconductor layer, a first inorganic insulating layer, a first metal layer, a second inorganic insulating layer, a second metal layer, a third inorganic insulating layer, a third metal layer, a first organic layer, an anode layer, a pixel defining layer, an organic functional layer and a cathode layer in sequence on one side of the substrate in a direction away from the substrate, wherein:

a boundary of at least one of the first inorganic insulating layer, the second inorganic insulating layer, and the third inorganic insulating layer coincides with a boundary of the substrate, and there is a gap between both a boundary of the first organic layer and a boundary of the pixel defining layer and the boundary of the substrate.

As described above, since the cutting area of the whole panel is not covered by the organic layer, the organic layer will not be cut when the whole panel is subject to laser cutting, thereby effectively avoiding short circuits caused by carbonization of the chip particles of the organic layer. Because the boundary of at least one inorganic insulating layer coincides with the boundary of the substrate, the dry etching of the inorganic insulating layer in the circuit-board bonding area can be minimized, thereby improving short circuits caused by the residual metal.

In another embodiment, the step 1 comprises:

forming a buffer layer, a semiconductor layer, a first inorganic insulating layer, a first metal layer, a second inorganic insulating layer, a second metal layer, a third inorganic insulating layer, a third metal layer, a first organic layer, an anode layer, a pixel defining layer, an organic functional layer and a cathode layer in sequence on one side of the substrate in a direction away from the substrate, wherein:

there is a gap between both a boundary of the first organic layer and a boundary of the pixel defining layer and the boundary of the substrate, and at least one of the first organic layer and the pixel defining layer covers boundaries of the first inorganic insulating layer, the second inorganic insulating layer and the third inorganic insulating layer.

As described above, since the cutting area of the whole panel is not covered by the organic layer, the organic layer will not be cut when the whole panel is subject to laser cutting, thereby effectively avoiding short circuits caused by carbonization of the chip particles of the organic layer. Meanwhile, by using the organic layer to cover the boundary of the inorganic insulating layer, even if there is residual metal at the section of the inorganic insulating layer when the metal layer is manufactured, the residual metal can be insulated from other conductive structures because it is covered by the organic layer, thereby improving short circuits caused by the residual metal.

In order to reduce the number of used mask plates, simplify the process and reduce the manufacturing cost, in the embodiments of the present disclosure, the related structure layers of the display area and the non-display area of the display panel can be manufactured in the same one layer. For example, patterns of inorganic insulating layers in the display area and the non-display area are simultaneously formed through a single mask patterning process; patterns of organic layers in the display area and the non-display area are simultaneously formed through the single mask patterning process; patterns of metal layers in the display area and the non-display area are simultaneously formed through the single mask patterning process; and more similar process solutions are not listed one by one herein.

In an embodiment of the present disclosure, the display panel is a flexible organic light-emitting display panel, and the employed substrate is a flexible organic substrate. When manufacturing such a whole panel, it is necessary to form the flexible organic substrate on a rigid carrier plate (e.g., a glass carrier plate), and then manufacture each layer structure of the display panel on the flexible organic substrate. After the whole panel is manufactured, the rigid carrier plate needs to be peeled off, so as to obtain a whole panel to be cut.

Thus far, the embodiments of the present disclosure have been described in detail. Some details well known in the art have not been described in order to avoid obscuring the concepts of the present disclosure. Those skilled in the art can now fully appreciate how to implement the solutions disclosed herein, in view of the foregoing description.

Although some specific embodiments of the present disclosure have been described in detail through examples, it should be understood by those skilled in the art that the above examples are for illustration only and are not intended to limit the scope of the present disclosure. It will be understood by those skilled in the art that modifications to the above embodiments or equivalent substitutions for partial technical features thereof can be made without departing from the scope and spirit of the present disclosure. The scope of the present disclosure is defined by the attached claims.

What is claimed is:

1. A display panel comprising a display area and a non-display area surrounding the display area, the display panel structurally comprising a substrate and a buffer layer, a semiconductor layer, a first inorganic insulating layer, a first metal layer, a second inorganic insulating layer, a second metal layer, a third inorganic insulating layer, a third metal layer, a first organic layer, an anode layer, a pixel defining layer, an organic functional layer and a cathode layer which are located on one side of the substrate and arranged in sequence in a direction away from the substrate, wherein:
the first metal layer comprises a gate and a first plate, the second metal layer comprises a second plate, and the third metal layer comprises a source and a drain which are connected with the semiconductor layer through via, wherein the semiconductor layer, the gate, the source and the drain constitute a thin film transistor device located in the display area, the first plate and the second plate constitute a capacitor device located in the display area, and the anode layer is connected with the drain through via, and the anode layer, the organic functional layer and the cathode layer constitute an organic emitting device located in the display area; and
the non-display area comprises a circuit-board bonding area having a bonding section exposed to a surface of the display panel, in which there is a ga s between a boundary of the first organic layer and the boundary of the substrate, and there is a gap between a boundary of the pixel defining layer and the boundary of the substrate,
the display panel further comprising a fourth inorganic insulating layer, a fourth metal layer and a second organic layer which are located between the first organic layer and the anode layer and are arranged in sequence in the direction away from the substrate, wherein:
a boundary of the fourth inorganic insulating layer coincides with the boundary of the substrate; and
there is a gap between a boundary of the second organic layer and the boundary of the substrate.

2. The display panel according to claim 1, wherein in the circuit-board bonding area, at least one of the first organic layer or the pixel defining layer covers boundaries of the first inorganic insulating layer, the second inorganic insulating layer, and the third inorganic insulating layer.

3. The display panel according to claim 2, further comprising: the fourth inorganic insulating layer, the fourth metal layer and the second organic layer which are located between the first organic layer and the anode layer and are arranged in sequence in the direction away from the substrate, wherein:
in the circuit-board bonding area, there is the gap between a boundary of the second organic layer and the boundary of the substrate, and at least one of the second organic layer or the pixel defining layer covers the boundary of the fourth inorganic insulating layer.

4. The display panel according to claim 3, wherein:
there is a metal structure at the boundary of the fourth inorganic insulating layer; and
the at least one of the second organic layer or the pixel defining layer covers the metal structure.

5. The display panel according to claim 2, wherein:
there is a metal structure at a boundary of at least one of the first inorganic insulating layer, the second inorganic insulating layer, or the third inorganic insulating layer; and
at least one of the first organic layer or the pixel defining layer covers the metal structure.

6. The display panel according to claim 5, wherein:
a gap between the metal structure and the boundary of the substrate is 100-150 microns; and
a gap between a boundary of an organic layer covering the metal structure and the boundary of the substrate is 80-95 microns.

7. The display panel according to claim 5, wherein:
the metal structure employs a same material as a metal layer farthest from the substrate in the bonding section; or
the material of the metal structure comprises at least one of materials employed by the metal layer farthest from the substrate in the bonding section.

8. The display panel according to claim 5, wherein:
there is a gap between the metal structure and a boundary of an inorganic insulating layer; and
the inorganic insulating layer is at least one of the first inorganic insulating layer, the second inorganic insulating layer, the third inorganic insulating layer, or the fourth inorganic insulating layer.

9. The display panel according to claim 1, wherein the bonding section comprises a third contact pad located in the third metal layer.

10. The display panel according to claim 9, wherein the bonding section further comprises a first contact pad located in the first metal layer and/or a second contact pad located in the second metal layer.

11. The display panel according to claim 1, wherein the bonding section comprises a fourth contact pad located in the fourth metal layer.

12. The display panel according to claim 11, wherein the bonding section further comprises at least one of a first contact pad located in the first metal layer, a second contact pad located in the second metal layer, and a third contact pad located in the third metal layer.

13. The display panel according to claim 1, further comprising a packaging structure layer, a fifth metal layer, a fifth inorganic insulating layer and a touch electrode layer which are located on one side of the cathode layer away from the substrate and are arranged in sequence in the direction away from the substrate, wherein:
the touch electrode layer comprises a plurality of touch electrode units arranged in an array and a first connection line for connecting adjacent touch electrode units in a first direction, and the fifth metal layer comprises a second connection line for connecting the adjacent touch electrode units through via in a second direction;
the bonding section comprises a fifth contact pad, and the fifth contact pad is located in the fifth metal layer or the touch electrode layer; and
a boundary of the fifth inorganic insulating layer coincides with the boundary of the substrate.

14. The display panel according to claim 1, wherein materials of the first metal layer and the second metal layer are the same.

15. The display panel according to claim 1, wherein materials of the third metal layer and the fourth metal layer are the same.

16. A display device comprising:
the display panel according to claim 1; and
a circuit board bound to the circuit-board bonding area of the display panel.

17. The display panel according to claim 1, wherein the circuit-board bonding area, a boundary of at least one of the first inorganic insulating layer, the second inorganic insulating layer, or the third inorganic insulating layer coincides with a boundary of the substrate.

18. A manufacturing method of a display panel, comprising:
manufacturing a whole panel comprising a plurality of display panel units, wherein each display panel unit comprises a display area and a non-display area surrounding the display area, the non-display area comprises a circuit-board bonding area, and a cutting area is arranged between adjacent display panel units;
cutting the whole panel along the cutting area to separate out each display panel unit, wherein each independent display panel unit is one display panel;
wherein manufacturing the whole panel comprises:
forming a buffer layer, a semiconductor layer, a first inorganic insulating layer, a first metal layer, a second inorganic insulating layer, a second metal layer, a third inorganic insulating layer, a third metal layer, a first organic layer, an anode layer, a pixel defining layer, an organic functional layer and a cathode layer in sequence on one side of the substrate in a direction away from the substrate, wherein a boundary of at least one of the first inorganic insulating layer, the second inorganic insulating layer, and the third inorganic insulating layer coincides with a boundary of the substrate, and there is a gap between a boundary of the first organic layer and the boundary of the substrate, and there is a gap between a boundary of the pixel defining layer and the boundary of the substrate,
wherein the display panel further comprises a fourth inorganic insulating layer, a fourth metal layer and a second organic layer which are located between the first organic layer and the anode layer and are a arranged in sequence in the direction away from the substrate, wherein;
a boundary of the fourth inorganic insulating layer coincides with the boundary of the substrate; and
there is a gap between a boundary of the second organic layer and the boundary of the substrate.

19. A manufacturing method of a display panel, comprising:
manufacturing a whole panel comprising a plurality of display panel units, wherein each display panel unit comprises a display area and a non-display area surrounding the display area, the non-display area comprises a circuit-board bonding area, and a cutting area is arranged between adjacent display panel units;
cutting the whole panel along the cutting area to separate out each display panel unit, wherein each independent display panel unit is one display panel;
wherein manufacturing the whole panel comprises:
forming a buffer layer, a semiconductor layer, a first inorganic insulating layer, a first metal layer, a second inorganic insulating layer, a second metal layer, a third inorganic insulating layer, a third metal layer, a first organic layer, an anode layer, a pixel defining layer, an organic functional layer and a cathode layer in sequence on one side of the substrate in a direction away from the substrate, wherein:
there is a gap between a boundary of the first organic layer and a boundary of the substrate, and there is a gap between a boundary of the pixel defining layer and the boundary of the substrate, and at least one of the first organic layer and the pixel defining layer covers boundaries of the first inorganic insulating layer, the second inorganic insulating layer, or the third inorganic insulating layer,
wherein the display panel further comprises a fourth inorganic insulating layer, a fourth metal layer and a second organic layer which are located between the first organic layer and the anode layer and are arranged in sequence in the direction away from the substrate, wherein:
a boundary of the fourth inorganic insulating layer coincides with the boundary of the substrate; and
there is a gap between a boundary of the second organic layer and the boundary of the substrate.

* * * * *

UNITED STATES PATENT AND TRADEMARK OFFICE
CERTIFICATE OF CORRECTION

| | | |
|---|---|---|
| PATENT NO. | : 12,501,779 B2 | Page 1 of 1 |
| APPLICATION NO. | : 17/421227 | |
| DATED | : December 16, 2025 | |
| INVENTOR(S) | : Yunsheng Xiao et al. | |

It is certified that error appears in the above-identified patent and that said Letters Patent is hereby corrected as shown below:

On the Title Page

Column 2, item (57) Abstract, Line 12, delete "wherein:" and insert -- wherein --

In the Claims

Column 15, Line 16, Claim 1, delete "substrate" and insert -- substrate, --

Column 15, Line 36, Claim 1, delete "emitting" and insert -- light-emitting --

Column 15, Line 39, Claim 1, delete "ga s" and insert -- gap --

Column 18, Line 1, Claim 18, delete "are a" and insert -- are --

Column 18, Line 1, Claim 18, delete "wherein;" and insert -- wherein: --

Signed and Sealed this
Tenth Day of February, 2026

John A. Squires
*Director of the United States Patent and Trademark Office*